United States Patent [19]

Letosky

[11] 3,768,024

[45] Oct. 23, 1973

[54] ZERO CROSSOVER DETECTOR CIRCUIT

[75] Inventor: Vincent H. Letosky, Rochester, Mich.

[73] Assignee: General Motors Corporation, Detroit, Mich.

[22] Filed: Sept. 25, 1972

[21] Appl. No.: 292,456

[52] U.S. Cl. .............. 328/150, 307/235 R, 328/117

[51] Int. Cl. .............................................. H03k 5/20

[58] Field of Search .................... 328/108, 115–117, 328/150, 151; 307/235 R

[56] References Cited

UNITED STATES PATENTS

| | | | |
|---|---|---|---|
| 3,639,779 | 2/1972 | Garrigus | 307/235 R |
| 3,683,284 | 8/1972 | Mueller | 307/235 R |

*Primary Examiner*—John Zazworsky
*Attorney*—Eugene W. Christen et al.

[57] ABSTRACT

First and second amplifiers amplify and invert the alternating current input signal. The output signal of one of the amplifiers is re-inverted by an inverter circuit which produces an output signal in phase with the input signal. The output signals of the other amplifier and the inverter are compared with respective direct current reference signals by respective comparator circuits which produce respective output signals of the same polarity when the magnitude of the amplifier and inverter output signals are greater than the corresponding reference signals. A flip-flop circuit is responsive to the output signal of one of the comparator circuits for producing an output signal of a selected polarity and to the output signal of the other comparator circuit for producing an output signal of another polarity. The flip-flop circuit and the inverter output signals are compared by another comparator circuit which produces an output signal when the input signal crosses zero from a negative to a positive polarity.

3 Claims, 2 Drawing Figures

ZERO CROSSOVER DETECTOR CIRCUIT

The subject invention is directed to a zero crossover detector circuit and, more specifically, to a zero crossover detector circuit which produces an output signal each time an alternating current input signal crosses zero from one polarity to the other polarity.

There are many applications which require a circuit which will produce an output signal at the precise crossover of an alternating current input signal from one polarity to the other polarity. Therefore, a zero crossover detector circuit which is substantially immune to noise, which is reliable in operation and which will produce an output signal at the precise crossover of an alternating current input signal of any wave from from one polarity to the other polarity is desirable.

It is, therefore, an object of this invention to provide an improved zero crossover detector circuit.

It is another object of this invention to provide an improved zero crossover detector circuit which produces an output signal each time an alternating current input signal of any wave form crosses zero from one polarity to the other polarity.

In accordance with this invention, a zero crossover detector circuit is provided wherein the input signal is amplified and amplified and inverted and then compared with respective direct current reference signals by respective comparator circuits which, when the magnitude of the amplified and the amplified and inverted input signals is greater than the corresponding reference signal, produce respective output signals of the same polarity which are applied to respective input terminals of an RS flip-flop circuit and the output signal of the flip-flop circuit is compared with the amplified and inverted input signal by another comparator circuit which produces an output signal when the input signal crosses zero from a negative to a positive polarity.

Figure 1:
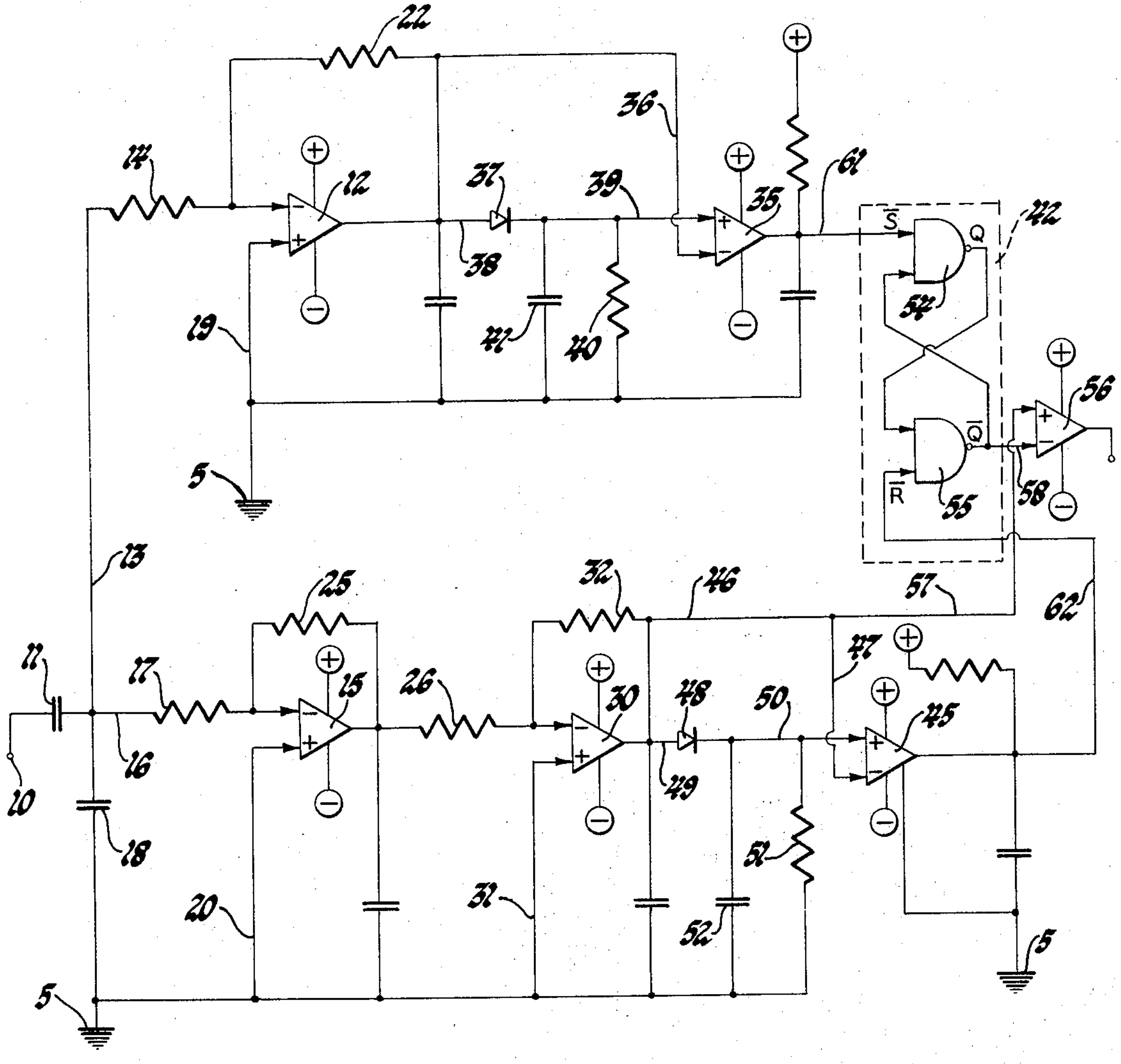
Figure 2:
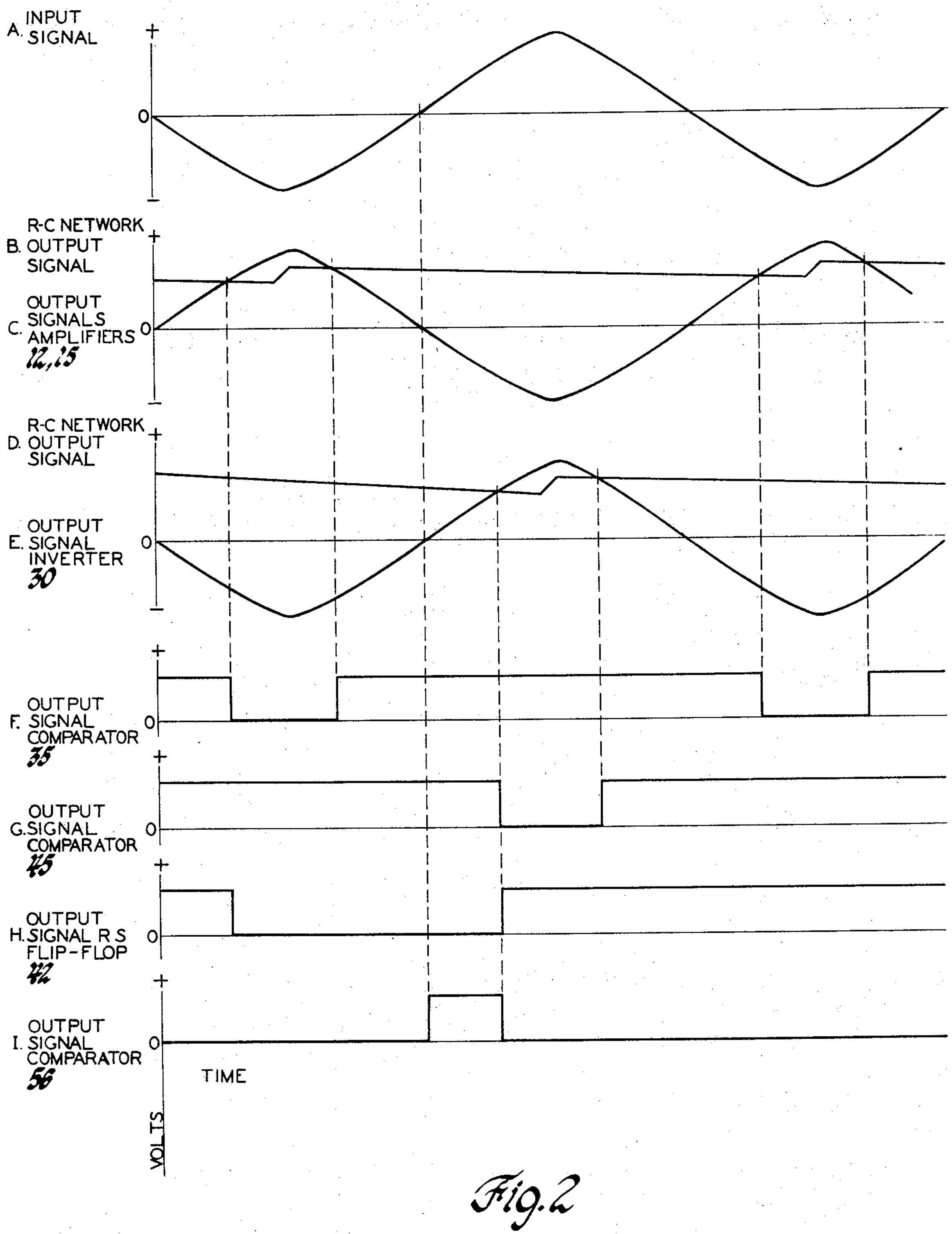

For a better understanding of the present invention, together with additional objects, advantages and features thereof, reference is made to the following description and accompanying drawings in which:

FIG. 1 schematically sets forth the zero crossover detector circuit of this invention for producing an output signal each time an alternating current input signal crosses zero from a negative to a positive polarity, and FIG. 2 is a set of curves useful in understanding the operation of the embodiment of FIG. 1.

Referring to FIGS. 1 and 2, the alternating current input signal, curve A of FIG. 2, may be applied across an input circuit point 10, which may be a terminal or any other electrical device or arrangement suitable for connection to external circuitry, and a common circuit point which, since it is the same point electrically throughout the system and may be a point of reference or ground potential, is illustrated in the drawing by the accepted schematic symbol and referenced by the numeral 5. Input circuit point 10 is connected through a coupling capacitor 11 to the inverting input terminal of operational amplifier 12, having an inverting input terminal and a non-inverting input terminal and an output terminal, through lead 13 and input resistor 14 and to the inverting input terminal of operational amplifier 15, also having an inverting input terminal and a non-inverting input terminal and an output terminal, through lead 16 and input resistor 17. Capacitor 18 is a filter capacitor which tends to smooth the input signal applied across input circuit points 10 and 5. Common circuit point 5 is connected to the non-inverting input terminal of both operational amplifiers 12 and 15 through respective leads 19 and 20. Feedback resistor 22, connected across the output and inverting input terminals of operational amplifier 12, and feedback resistor 25, connected across the output and inverting input terminals of operational amplifier 15, are proportioned relative to respective input resistors 14 and 17 to provide a selected same gain for both of operational amplifiers 12 and 15.

The output terminal of operational amplifier 15 is connected through input resistors 26 to the inverting input terminal of operational amplifier 30, also having an inverting input terminal and a non-inverting input terminal and an output terminal. Common circuit point 5 is connected to the non-inverting input terminal of operational amplifier 30 through lead 31. Feedback resistor 32 connected across the output and inverting input terminals of operational amplifier 30 is proportioned relative to input resistor 26 to provide a gain of 1 for operational amplifier 30. Consequently, operational amplifier 30 functions as an inverter circuit for inverting the output signal of operational amplifier 15 and producing an output signal in phase with the input signal.

Operational amplifiers are commercially available logic elements well known in the art. One example of a commercially available operational amplifier circuit suitable for use as operational amplifiers 12, 15 and 30 is a type MC–1741P–1 marketed by Motorola Semiconductor Products, Inc.

The output terminal of operational amplifier 12 is connected to the negative input terminal of a comparator circuit 35 through lead 36 and to the anode electrode of diode 37 through lead 38, the cathode electrode of which is connected to the positive input terminal of comparator circuit 35 through lead 39. Connected in parallel across the junction between the cathode electrode of diode 37 and the positive input terminal of comparator circuit 35 and common circuit point 5 is a resistor 40 and a capacitor 41. Diode 37 half-wave rectifies the output signal of operational amplifier 12 and resistor 40 and capacitor 41 comprise an RC network which produces a direct current output signal which "rides the peaks" of the rectified output signal of amplifier 12, as shown by curve B of FIG. 2. That is, the circuitry including diode 37, resistor 40 and capacitor 41 is responsive to the output signal of operational amplifier 12 for producing a corresponding direct current reference signal.

The output terminal of operational amplifier 30 is connected to the negative input terminal of comparator circuit 45 through leads 46 and 47 and to the anode electrode of diode 48 through lead 49, the cathode electrode of which is connected to the positive input terminal of comparator circuit 45 through lead 50. Connected in parallel across the junction between the cathode electrode of diode 48 and the positive input terminal of comparator circuit 45 and common circuit point 5 is a resistor 51 and a capacitor 52. Diode 48 half-wave rectifies the output signal of inverter circuit 30 and resistor 51 and capacitor 52 comprise an RC network which produces a direct current output signal which "rides the peaks" of the rectified output signal of inverter circuit 30, as shown by curve D of FIG. 2. That is, the circuitry including diode 48, resistor 51 and capacitor 52 is responsive to the output signal of the inverter circuit 30 for producing a corresponding direct current reference signal.

By producing reference signals which "ride the peaks" of the rectified output signals of operational amplifiers 12 and 30, the possibility of noise, unwanted or foreign signals causing a malfunction of the circuit of this invention is virtually eliminated.

Comparator circuits 35 and 45 are commercially available logic elements well known in the art which compare direct current input signals and produce a positive polarity potential output signal when the magnitude of the signal present upon the positive input terminal is greater than the magnitude of the signal applied to the negative input terminal and a zero or ground potential output signal when the magnitude of the signal applied to the negative input terminal is greater than that of the signal applied to the positive input terminal. One example of a commercially available comparator circuit suitable for use as comparator circuits 35 and 45 is a type LM-311-D marketed by National Semiconductor Corporation.

As the output signal of amplifier 12 is applied to the negative input terminal of comparator circuit 35 and the corresponding direct current reference signal produced by diode 37, resistor 40 and capacitor 41 is applied to the positive input terminal of comparator circuit 35, this device compares the output signal of operational amplifier 12 and the corresponding direct current reference signal for producing a zero or ground potential output signal while the magnitude of the output signal of operational amplifier 12 is greater than that of the corresponding direct current reference signal, as shown by curve F of FIG. 2. While the magnitude of the corresponding direct current reference signal is greater than the magnitude of the output signal of operational amplifier 12, comparator 35 produces a positive polarity output signal.

As the output signal of inverter circuit 30 is applied to the negative input terminal of comparator circuit 45 and the corresponding direct current reference signal produced by diode 48, resistor 51 and capacitor 52 is applied to the positive input terminal of comparator 45, this device compares the output signal of inverter circuit 30 and the corresponding direct current reference signal for producing an output signal of a polarity the same as comparator circuit 35, zero or ground potential, while the magnitude of the output signal of inverter circuit 30 is greater than that of the corresponding direct current reference signal, as shown by curve G of FIG. 2. While the magnitude of the corresponding direct current reference signal is greater than the magnitude of the output signal of inverter circuit 30, comparator 45 produces a positive polarity output signal.

In accordance with logic terminology well known in the art, logic signals are referred to as being in the "High" or logic 1 state or in the "Low" of logic 0 state. For purposes of this specification, and without intention or inference of a limitation thereto, the "High" or logic 1 signals will be considered to be of a positive polarity potential and the "Low" or logic 0 signals will be considered to be of zero or ground potential.

The output terminal of comparator 35 is applied to the $\overline{S}$ input terminal and the output terminal of comparator circuit 45 is applied to the $\overline{R}$ input terminal of a conventionally constructed RS flip-flop circuit 42 comprising respective NAND gates 54 and 55 through respective leads 51 and 52. The RS flip-flop circuit is a logic element well known in the art which produces a logic 1 signal upon the Q output terminal upon the application of a logic 0 signal to the $\overline{S}$ input terminal and a logic 1 signal upon the $\overline{Q}$ output terminal upon the application of a logic 0 signal to the $\overline{R}$ input terminal. It is the function of the RS flip-flop circuit 42 to produce a logic 0 signal upon the $\overline{Q}$ output terminal during the period that the input signal crosses zero from one polarity to the other polarity. In the embodiment of FIG. 1, the RS flip-flop circuit 42 produces a logic 0 signal upon the $\overline{Q}$ output terminal when the input signal crosses zero from a negative to a positive polarity, as shown by curve H of FIG. 2.

The output terminal of inverter circuit 30 is also connected to the positive input terminal of comparator circuit 56 through leads 46 and 57 and the $\overline{Q}$ output terminal of the RS flip-flop circuit is connected to the negative input terminal of comparator circuit 56 through lead 58. Comparator circuit 56 also may be a type LM-311-D marketed by National Semiconductor Corporation.

The input signal, curve A of FIG. 2, is applied through input circuit points 10 and 5, coupling capacitor 11 and respective input resistors 14 and 17 to the inverting input terminal of each of operational amplifiers 12 and 15. As the input signal is applied to the inverting input terminal of both, operational amplifiers 12 and 15 amplify and invert the input signal, curve C of FIG. 2. The amplified and inverted input signal appearing upon the output terminal of operational amplifier 15 is applied through input resistor 26 to the inverting input terminal of operational amplifier 30 which, as previously explained, functions only as an inverter circuit which re-inverts the amplified and inverted signal appearing upon the output terminal of operational amplifier 15, curve E. The amplified and inverted input signal appearing upon the output terminal of operational amplifier 12 is applied to the negative input terminal of comparator 35 and is rectified by diode 37 and applied across the resistor 40-capacitor 41 RC network. This RC network produces a direct current reference signal which "rides the peaks" of the rectified output signal of operational amplifier 12, curve B, which is applied to the positive input terminal of comparator 35. The output signal appearing upon the output terminal of inverter circuit 30 is applied to the negative input terminal of comparator 45 and is rectified by diode 48 and applied to the resistor 51-capacitor 52 RC network. This RC network produces a direct current reference signal which "rides the peaks" of the rectified output signal of inverter circuit 30, curve D, which is applied to the positive input terminal of comparator 45. Consequently, the input signal which is amplified and inverted by operational amplifier 12 is compared with the corresponding direct current reference signal produced by the resistor 40-capacitor 41 RC network and the input signal which is amplified and inverted by operational amplifier 15 and re-inverted by inverter circuit 30 is compared with the corresponding direct current reference signal produced by the resistor 51-capacitor 52 RC network.

Referring to FIG. 2, at the beginning of each negative half circle of the input signal, curve A, the direct current reference signal, curve B, produced by the RC network of resistor 40 and capacitor 41 and applied to the positive input terminal of comparator circuit 35, is more positive than the amplified and inverted input signal to which it corresponds upon the output terminal of operational amplifier 12, curve C, which is applied to the negative input terminal of comparator circuit 35. Consequently, a logic 1 signal appears upon the output terminal of comparator circuit 35, curve F. As the input signal progresses through each negative half cycle, the 180° out-of-phase amplified and inverted input signal, curve C, increases in a positive direction until it reaches a magnitude substantially equal to the magnitude of the corresponding direct current reference signal, curve B. At this time, comparator circuit 35 switches to the state in which a logic 0 signal appears upon the output terminal thereof, curve F, which is applied to the $\overline{S}$ input terminal of NAND gate 54 of the RS flip-flop circuit 42. Consequently, a logic 1 signal appears upon the Q output terminal and a logic 0 signal, curve H, appears upon the $\overline{Q}$ output terminal of RS flip-flop circuit 42 which is applied to the negative input terminal of comparator circuit 56. As the re-inverted input signal upon the output terminal of inverter circuit 30, curve E, which is applied to the positive input terminal of comparator circuit 56 is of a negative polarity at this time, a logic 0 signal, curve I, is present upon the output terminal of comparator circuit 56. As the input signal continues through the last half of each negative half cycle, the in-phase re-inverted input signal, curve E, increases in a positive direction until it crosses zero and begins to go positive. This positive polarity signal, which occurs at each point of zero crossover of the input signal from a negative to a positive polarity, is applied to the positive input terminal of comparator circuit 56 to switch this device to the state in which a logic 1 output signal, curve I, appears upon the output terminal thereof. The leading edge of this logic 1 output signal, therefore, occurs precisely at each zero crossover point of the input signal from a negative to a positive polarity. As the input signal progresses through each positive half cycle, the in-phase re-inverted input signal applied to the positive input terminal of comparator circuit 45, curve E, increases in a positive direction until it reaches a magnitude substantially equal to the magnitude of the corresponding direct current reference signal produced by the RC network of resistor 51 and capacitor 52, curve D, applied to the negative input terminal of comparator circuit 45. At this time, comparator circuit 45 switches to the state in which a logic 0 signal appears upon the output terminal thereof, curve G, which is applied to the $\overline{R}$ input terminal of NAND gate 55 of the RS flip-flop circuit 42. Consequently, a logic 0 signal appears upon the Q output terminal and a logic 1 signal, curve H, appears upon the $\overline{Q}$ output terminal of RS flip-flop circuit 42 which is applied to the negative input terminal of comparator circuit 56. As RS flip-flop circuit 42 is so designed that this logic 1 signal is of a magnitude greater than that of the re-inverted input signal, curve E, comparator circuit 56 switches to the state in which a logic 0 signal appears upon the output terminal thereof, curve I. At this time, the zero crossover detector circuit of this invention is reset to a condition for producing an output signal upon the output terminal of comparator 56 having a leading edge occuring precisely at the next zero crossover point of the input signal from a negative to a positive polarity.

Throughout this specification, specific circuit elements and electrical polarities have been set forth and described. It is to be specifically understood that alternative circuit elements having similar electrical characteristics and compatible electrical polarities may be substituted therefor without departing from the spirit of the invention.

While two embodiments of this invention have been shown and described, it will be obvious to those skilled in the art that verious modifications and substitutions may be made without departing from the spirit of the invention which is to be limited only within the scope of the appended claims.

What is claimed is:

1. A zero crossover detector circuit for producing an output signal each time an alternating current input signal crosses zero from one polarity to the other polarity comprising: input circuit means across which said input signal may be applied; first and second amplifier circuits for amplifying said alternating current input signal and producing respective output signals; an inverter circuit for inverting the said output signal of a selected one of said amplifier circuits and producing an output signal; first circuit means responsive to the said output signal of the other one of said amplifier circuits for producing a corresponding direct current reference signal; second circuit means responsive to the said output signal of said inverter circuit for producing a corresponding direct current reference signal; a first comparator circuit for comparing the said output signal of said other one of said amplifier circuits and the said corresponding direct current reference signal for producing an output signal of a selected polarity while the magnitude of said output signal of said other one of said amplifier circuits is greater than that of said corresponding direct current reference signal; a second comparator circuit for comparing the said output signal of said inverter circuit and the said corresponding direct current reference signal for producing an output signal of a polarity the same as said first comparator circuit while the magnitude of said output signal of said inverter circuit is greater than that of said corresponding direct current reference signal; a flip-flop circuit responsive to the said output signal of said first comparator circuit for producing an output signal of a selected one polarity and to the said output signal of said second comparator circuit for producing an output signal of an other polarity; and third comparator circuit means responsive to the said output signal of said inverter circuit and the said output signal of said flip-flop circuit for producing an output signal when the said output signal of said inverter circuit crosses zero from one polarity to the other polarity.

2. A zero crossover detector circuit for producing an output signal each time an alternating current input signal crosses zero from one polarity to the other polarity comprising: input circuit means across which said input signal may be applied; first and second amplifier circuits for amplifying and inverting said alternating current input signal and producing respective output signals 180° out of phase with said input signal; an inverter circuit for inverting the said output signal of a selected one of said amplifier circuits and producing an output signal in phase with said input signal; first circuit means responsive to the said output signal of the other one of said amplifier circuits for producing a corresponding direct current reference signal; second circuit means responsive to the said output signal of said inverter circuit for producing a corresponding direct current reference signal; a first comparator circuit for comparing the said output signal of said other one of said amplifier circuits and the said corresponding direct current reference signal for producing an output signal of a selected polarity while the magnitude of said output signal of said other one of said amplifier circuits is greater than that of said corresponding direct current reference signal; a second comparator circuit for comparing the said output signal of said inverter circuit and the said corresponding direct current reference signal for producing an output signal of a polarity the same as said first comparator circuit while the magnitude of said output signal of said inverter circuit is greater than that of said corresponding direct current reference signal; an RS type flip-flop circuit having $\overline{S}$ and $\overline{R}$ input terminals and a $\overline{Q}$ output terminal responsive to the application of said output signal of said first comparator circuit to said $\overline{S}$ input terminal for producing an output signal upon said $\overline{Q}$ output terminal of a selected one polarity and to the application of said output signal of said second comparator circuit to said $\overline{R}$ input terminal for producing an output signal upon said $\overline{Q}$ output terminal of an other polarity; and third comparator circuit means responsive to the said output signal of said inverter circuit and the said output signal of said flip-flop circuit for producing an output signal when the said output signal of said inverter circuit crosses zero from a negative polarity to a positive polarity.

3. A zero crossover detector circuit for producing an output signal each time an alternating current input signal crosses zero from one polarity to the other polarity comprising: input circuit means including an input circuit point and a common circuit point across which said input signal may be applied; first, second and third operational amplifiers each having an inverting input terminal and a non-inverting input terminal and an output terminal; means for connecting said input circuit point to said inverting input terminal of both said first and second operational amplifiers and for connecting said common circuit point to said non-inverting input terminal of both said first and second operational amplifiers; means for connecting said output terminal of said second operational amplifier to said inverting input terminal of said third operational amplifier; means for connecting said common circuit point to said non-inverting input terminal of said third operational amplifier; first, second and third comparator circuits each having a positive input terminal and a negative input terminal and an output terminal; a first diode having anode and cathode electrodes; a first capacitor; a first resistor; means for connecting said output terminal of said first operational amplifier to said negative input terminal of said first comparator circuit and to said anode electrode of said first diode; means for connecting said cathode electrode of said first diode to said positive input terminal of said first comparator circuit; means for connecting said first capacitor and said first resistor in parallel across the junction between said cathode electrode of said first diode and said positive input terminal of said first comparator circuit and said common circuit point; a second diode having an anode and cathode electrodes; a second capacitor; a second resistor; means for connecting said output terminal of said third operational amplifier to said negative input terminal of said second comparator circuit and to said anode electrode of said second diode; means for connecting said cathode electrode of said second diode to said positive input terminal of said second comparator circuit; means for connecting said second capacitor and said second resistor in parallel across the junction between said cathode electrode of said second diode and said positive input terminal of said second comparator circuit and said common circuit point; an RS flip-flop circuit having $\overline{S}$ and $\overline{R}$ input terminals and a $\overline{Q}$ output terminal; means for connecting said output terminal of said first comparator circuit to said $\overline{S}$ input terminal of said RS flip-flop circuit; means for connecting said output terminal os said second comparator circuit to said $\overline{R}$ input terminal of said RS flip-flop circuit; means for connecting said output terminal of said third operational amplifier to said positive input terminal of said third comparator circuit; and means for connecting said $\overline{Q}$ output terminal of said RS flip-flop circuit to said negative input terminal of said third comparator circuit.

* * * * *

UNITED STATES PATENT OFFICE
CERTIFICATE OF CORRECTION

Patent No. 3,768,024 Dated October 23, 1973

Inventor(s) Vincent H. Letosky

It is certified that error appears in the above-identified patent and that said Letters Patent are hereby corrected as shown below:

Column 1, line 14, "from" should read -- form -- . Column 3, line 56, after "Low", "of" should read -- or --. Column 4, line 34, after "inverted" insert -- input --; line 64, "circle" should read -- cycle --. Column 6, line 7, "verious" should read -- various --. Column 8, line 35, "os" should read -- of --.

Signed and sealed this 6th day of August 1974.

(SEAL)
Attest:

McCOY M. GIBSON, JR.
Attesting Officer

C. MARSHALL DANN
Commissioner of Patents